United States Patent [19]
Sevic et al.

[11] Patent Number: 5,872,481
[45] Date of Patent: Feb. 16, 1999

[54] EFFICIENT PARALLEL-STAGE POWER AMPLIFIER

[75] Inventors: John F. Sevic; Richard J. Camarillo, both of San Diego, Calif.

[73] Assignee: QUALCOMM Incorporated, San Diego, Calif.

[21] Appl. No.: 767,124

[22] Filed: Dec. 9, 1996

Related U.S. Application Data

[63] Continuation-in-part of Ser. No. 579,169, Dec. 27, 1995.

[51] Int. Cl.$^6$ .................................................. H03F 3/68
[52] U.S. Cl. ......................... 330/51; 330/124 R; 330/295
[58] Field of Search .................... 330/51, 124 R, 330/133, 134, 285, 295

[56] References Cited

U.S. PATENT DOCUMENTS

| | | | |
|---|---|---|---|
| 3,325,738 | 6/1967 | Busby et al. | 325/477 |
| 3,469,195 | 9/1969 | Harwood | 325/405 |
| 3,514,710 | 5/1970 | Janning, Jr. | 330/29 |
| 3,665,507 | 5/1972 | Pell | 325/315 |
| 3,886,380 | 5/1975 | Sobajima et al. | 307/237 |
| 4,041,396 | 8/1977 | Fedde | 325/150 |
| 4,054,849 | 10/1977 | Yamada | 333/14 |
| 4,158,180 | 6/1979 | Challen | 330/298 |
| 4,207,538 | 6/1980 | Goel | 330/277 |
| 4,223,274 | 9/1980 | Paulke et al. | 330/133 |
| 4,263,560 | 4/1981 | Ricker | 330/129 |
| 4,320,350 | 3/1982 | Drapac | 330/202 |
| 4,380,711 | 4/1983 | Cunningham | 307/491 |
| 4,426,625 | 1/1984 | Harwood et al. | 330/254 |
| 4,439,744 | 3/1984 | Kumar et al. | 330/285 |
| 4,447,783 | 5/1984 | Quick | 323/275 |
| 4,495,648 | 1/1985 | Giger | 455/73 |
| 4,500,848 | 2/1985 | Marchand et al. | 330/285 |
| 4,510,460 | 4/1985 | Tamura | 330/285 |
| 4,514,702 | 4/1985 | Zogg | 330/254 |
| 4,523,155 | 6/1985 | Walczak et al. | 330/279 |
| 4,560,949 | 12/1985 | Young | 330/284 |
| 4,578,603 | 3/1986 | McPherson | 307/493 |
| 4,592,252 | 6/1986 | Ecer | 76/108 |
| 4,593,409 | 6/1986 | Miller | 455/73 |
| 4,602,218 | 7/1986 | Vilmur et al. | 330/279 |
| 4,607,234 | 8/1986 | Nordholt et al. | 330/278 |
| 4,613,990 | 9/1986 | Halpern | 455/33 |
| 4,654,882 | 3/1987 | Ikeda | 455/88 |
| 4,709,403 | 11/1987 | Kikuchi | 455/126 |
| 4,723,304 | 2/1988 | Maeda | 455/69 |
| 4,727,337 | 2/1988 | Jason | 330/298 |
| 4,740,964 | 4/1988 | Stalick | 370/110 |
| 4,797,632 | 1/1989 | Guery | 330/285 |

(List continued on next page.)

FOREIGN PATENT DOCUMENTS

| | | | |
|---|---|---|---|
| 0537733 | 4/1993 | European Pat. Off. | H03G 3/20 |
| 0594358 | 4/1994 | European Pat. Off. | H03G 3/20 |
| 59-97213 | 6/1984 | Japan . | |

OTHER PUBLICATIONS

"A 900 MHz CMOS RF Power Amplifier with Programmable Output Power" by Maryam Rofougaran et al.; Integrated Circuits & Systems Laboratory.

D. Hay et al. "The Exploratory Development of a High Power S–Band Solid State Radar Transmitter", *IEEE International Radar Conference*, May 7, 1990, pp. 135–140.

*Primary Examiner*—Steven Mottola
*Attorney, Agent, or Firm*—Russell B. Miller; Brian S. Edmonston; Roger W. Martin

[57] ABSTRACT

An amplifier circuit for providing an amplified signal in response to an input signal. The amplifier circuit includes an input network for applying the input signal to a selected at least one of a plurality of amplifier stages. An output network is provided for coupling the amplified signal from the selected at least one amplifier stage. The appropriate amplifier stage is selected by a control circuit in response to a desired power value of the amplified signal. By selectively activating only the amplifier stage(s) that are necessary to provide the desired level of output power, increased DC efficiency can be accomplished in applications that require an amplifier which operates linearly over a wide dynamic range.

8 Claims, 12 Drawing Sheets

U.S. PATENT DOCUMENTS

| | | | |
|---|---|---|---|
| 4,816,772 | 3/1989 | Klotz | 330/254 |
| 4,870,698 | 9/1989 | Katsuyama et al. | 455/67 |
| 4,893,093 | 1/1990 | Croanuer et al. | 330/295 |
| 4,901,032 | 2/1990 | Komiak | 330/277 |
| 4,901,307 | 2/1990 | Gilhousen et al. | 370/18 |
| 5,029,298 | 7/1991 | Chiba et al. | 330/285 |
| 5,083,096 | 1/1992 | Miyazaki | 330/279 |
| 5,099,204 | 3/1992 | Wheatley, III | 330/279 |
| 5,107,225 | 4/1992 | Wheatley, III et al. | 330/279 |
| 5,132,634 | 7/1992 | Suarez | 330/129 |
| 5,136,300 | 8/1992 | Clarke et al. | 342/175 |
| 5,146,180 | 9/1992 | Hyakutake | 330/254 |
| 5,152,004 | 9/1992 | Vaisanen et al. | 455/68 |
| 5,175,871 | 12/1992 | Kunkel | 455/69 |
| 5,192,919 | 3/1993 | Wieczorek | 330/129 |
| 5,251,330 | 10/1993 | Chiba | 455/91 |
| 5,256,987 | 10/1993 | KIbayashi et al. | 330/295 |
| 5,339,046 | 8/1994 | Kornfeld et al. | 330/277 |
| 5,420,537 | 5/1995 | Weedon et al. | 330/295 X |
| 5,438,684 | 8/1995 | Schwent et al. | 455/89 |
| 5,541,554 | 7/1996 | Stengel et al. | 330/51 |
| 5,548,246 | 8/1996 | Yamamoto et al. | 330/51 |
| 5,568,086 | 10/1996 | Schuss et al. | 330/124 |
| 5,608,353 | 3/1997 | Pratt | 330/295 |

EFFICIENT PARALLEL-STAGE POWER AMPLIFIER

BACKGROUND OF THE INVENTION

I. Related Applications

This application is a Continuation-In-Part of U.S. patent application Ser. No. 08/579,169, filed Dec. 27, 1995, which is currently pending.

II. Field of the Invention

The present invention relates to signal amplifiers. More specifically, the present invention relates to methods and circuit arrangements for providing highly efficient, linear signal amplification over a wide dynamic range by employing multiple parallel amplifying devices.

III. Description of the Related Art

The use of code division multiple access (CDMA) modulation techniques is one of several techniques for facilitating communications in which a large number of system users are present. Although other techniques such as time division multiple access (TDMA), frequency division multiple access (FDMA), and amplitude modulation (AM) modulation schemes such as amplitude companded single sideband (ACSSB) are known, CDMA has significant advantages over these other techniques. The use of CDMA techniques in a multiple access communication system is disclosed in U.S. Pat. No. 4,901,307 entitled "SPREAD SPECTRUM MULTIPLE ACCESS COMMUNICATION SYSTEM USING SATELLITE OR TERRESTRIAL REPEATERS", assigned to the assignee of the present invention, the disclosure thereof incorporated by reference.

In the just mentioned patent, a multiple access technique is disclosed where a large number of mobile telephone system users each having a transceiver communicate through satellite repeaters or terrestrial base stations (also known as cell-site stations, or for short cell-sites) using CDMA spread spectrum communication signals. In using CDMA communications, the frequency spectrum can be reused multiple times thus permitting an increase in system user capacity. The use of CDMA results in a much higher spectral efficiency than can be achieved using other multiple access techniques. In a CDMA system, increases in system capacity may be realized by controlling the transmitter power of the portable units associated with each user so as to reduce interference to other system users.

In a terrestrial CDMA cellular communication system it is extremely desirable to maximize the capacity in terms of the number of simultaneous communication links capable of being supported by a given system bandwidth. System capacity can be maximized if the transmitter power of each portable unit is controlled such that the transmitted signal arrives at the cell-site receiver with the minimal signal to noise interference ratio which allows acceptable data recovery. If a signal transmitted by a portable unit arrives at the cell-site receiver at a power level that is too low, the bit-error-rate may be too high to permit high quality communications. If, on the other hand, acceptable communication is established by setting the mobile unit transmitted signal at a power level that is too high when received at the cell site receiver, interference will occur with other mobile unit transmitted signals that are sharing the same channel, i.e. bandwidth. This interference may adversely affect communications with other portable units unless the total number of communicating portable units is reduced.

The signals received from each portable unit at the cell-site station are measured, and the measurement results compared with a desired power level. Based on this comparison the cell-site determines the deviation in the received power level from that which is necessary to maintain the desired communications. Preferably the desired power level is a minimum power level necessary to maintain quality communications so as to result in a reduction in system interference.

The cell-site station then transmits a power control command signal to each system user so as to adjust or "fine tune" the transmit power of the portable unit. This command signal is used by the portable unit to change the transmit power level closer to a level required to sustain communication on the reverse link between the portable unit and the cell-site. As channel conditions change, typically due to motion of the portable unit, both the portable unit receiver power measurement and the power control feedback from the cell-site station continually readjust the transmit power level so as to maintain a proper power level.

The utilization of these types of power control techniques requires that the portable unit transmitter be capable of linear operation over a relatively wide dynamic range. Since existing portable units operate on battery power, it is also necessary that the transmitter power amplifier be capable of efficient, linear operation over the dynamic range typical of CDMA communication systems. Since conventional power amplifier designs, both variable gain and fixed gain, have been found to lack the requisite efficiency and linearity over a wide dynamic range, there exists a need for a power amplifier capable of providing this type of performance.

SUMMARY OF THE INVENTION

Broadly, the invention takes the form of an amplifier circuit for providing an amplified signal in response to an input signal in a manner which improves efficiency while maintaining linearity. The amplifier circuit includes an input switch for applying the input signal to a selected one of first and second parallel-connected amplifier stages, where the first amplifier stage is biased to provide constant gain over a first input signal dynamic range and the second amplifier stage is biased to provide constant gain over a second input signal dynamic range. An output network is provided for coupling the amplified signal from the selected amplifier stage.

In a preferred embodiment the output network includes an output switch for connection to an output node of the selected amplifier stage, and further includes a power measurement circuit for measuring power of the amplified signal. A switch control circuit may be provided for controlling the connection of the input switch and the output switch to the other one of the amplifier stages when measured power of the amplified output signal departs from a predetermined output range. In a particular implementation of the invention within a digital transmitter, the switch control circuit only allows the input switch matrix and the output network to select a different one of the amplifier stages during transitions between the digital words or symbols within the input signal.

In one embodiment the input signal is provided directly to a plurality of different final stage transistor devices. The respective gates of the devices are isolated at DC by blocking capacitors, but are tied together at the RF frequency of the input signal. Switch logic selectively provides a DC bias current only to the devices which are required for amplification of the input signal. Thus, by biasing on only the devices that are required for the present amplifition of the input signal, DC efficiency is improved significantly.

BRIEF DESCRIPTION OF THE DRAWINGS

The features and advantages of the present invention will become more apparent from the detailed description set forth below when taken in conjunction with the drawings in which like reference characters correspond throughout and wherein.

DETAILED DESCRIPTION OF THE PREFERRED EMBODIMENTS

I. Introduction to CDMA Cellular Communications

Figure 1:
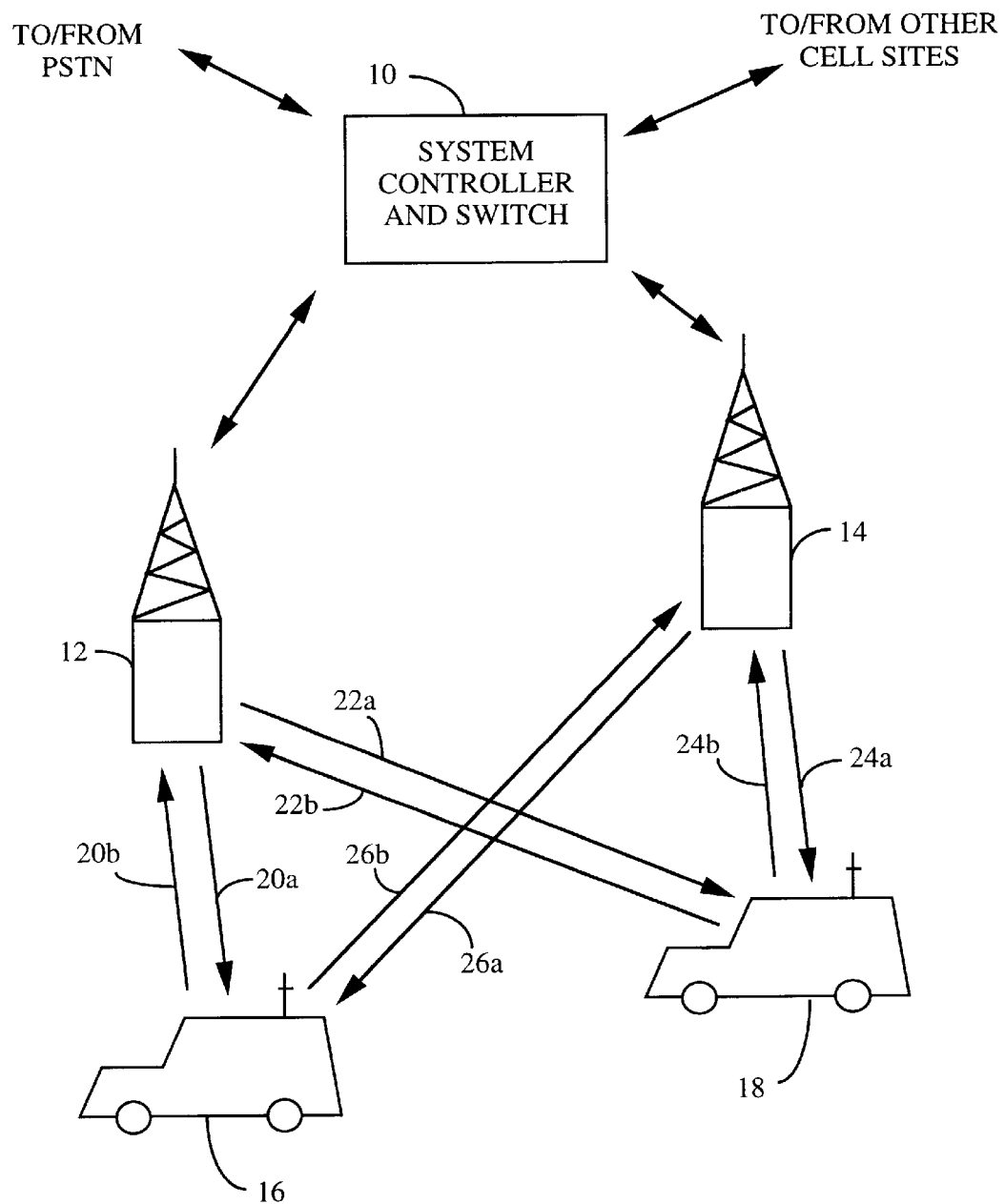
FIG. 1 is a schematic overview of an exemplary cellular telephone system which includes at least one cell-site and a plurality of portable units.

An exemplary terrestrial cellular telephone communication system is illustrated in FIG. 1. The system illustrated in FIG. 1 utilizes CDMA modulation techniques in communications between the system portable user, and the cell-sites. Each portable user communicates with one or more cell-sites by way of a portable transceiver (e.g., portable telephones), each of which includes a transmitter in which may be incorporated an efficient parallel power amplifier of the present invention. In this discussion the term "portable unit" is used to refer generally to the remote subscriber station for the purposes of this description. Note, however, that the portable unit may be fixed in location. The portable unit may be part of a multiple user concentrated subscriber system. The portable unit may be used to carry voice, data, or a combination of signal types. The term "portable unit" is a term of art and is not meant to limit the scope or function of the unit.

In FIG. 1, system controller and switch 10 typically includes appropriate interface and processing hardware for providing system control information to the cell-sites. Controller 10 controls the routing of telephone calls from the public switched telephone network (PSTN) to the appropriate cell-site for transmission to the appropriate portable unit. Controller 10 also controls the routing of calls from the portable units via at least one cell-site to the PSTN. Controller 10 may direct calls between portable users via the appropriate cell-site stations since the portable units do not typically communicate directly with one another.

Controller 10 may be coupled to the cell-sites by various means such as dedicated telephone lines, optical fiber links or by radio frequency communications. In FIG. 1, two exemplary cell-sites, 12 and 14, are shown along with two exemplary portable units 16 and 18. Arrows 20a–20b and 22a–22b respectively define the possible communication links between cell-site 12 and portable units 16 and 18. Similarly, arrows 24a–24b and arrows 26a–26b respectively define the possible communication links between cell-site 14 and portable units 18 and 16. Cell-sites 12 and 14 normally transmit using equal power.

Portable unit 16 measures the total power received from cell-sites 12 and 14 upon paths 20a and 26a. Similarly, portable unit 18 measures the power received from cell-sites 12 and 14 upon paths 22a and 24a. In each of portable units 16 and 18, signal power is measured in the receiver where the signal is a wideband signal. Accordingly, this power measurement is made prior to correlation of the received signal with a pseudo-noise (PN) spectrum spreading signal.

When portable unit 16 is closer to cell-site 12, the received signal power typically will be dominated by the signal traveling path 20a. When portable unit 16 is nearer to cell-site 14, the received power typically will be dominated by the signal traveling on path 26a. Similarly, when portable unit 18 is closer to cell-site 14, the received power typically will be dominated by the signal on path 24a. When portable unit 18 is closer to cell-site 12, the received power typically will be dominated by the signal traveling on path 22a.

Each of portable units 16 and 18 uses the resultant measurement to estimate the path loss to the closest cell-site. The estimated path loss, together with knowledge of the portable antenna gain and the cell-site G/T is used to determine the nominal transmitter power required to obtain the desired carrier-to-noise ratio in the cell-site receiver. The knowledge by the portable units of the cell-site parameters may be either fixed in memory or transmitted in cell-site information broadcast signals, setup channel, to indicate other than nominal conditions for a particular cell-site.

As the portable units 16 and 18 move throughout the cell-sites, it becomes necessary to regulate the transmit power of each over a wide dynamic range. Although power amplifiers exist which are capable of signal amplification over a wide dynamic range, the associated gain variation tends to complicate the design of the remainder of the portable unit transmitter. In addition to exhibiting constant gain, it is also desired that the portable unit transmit amplifier conserve battery power by operating efficiently over the entire dynamic range of interest. In accordance with the invention, a highly efficient, linear gain power amplifier is provided which meets these and other objectives.

II. Overview of Efficient Parallel Power Amplifier

Figure 2:
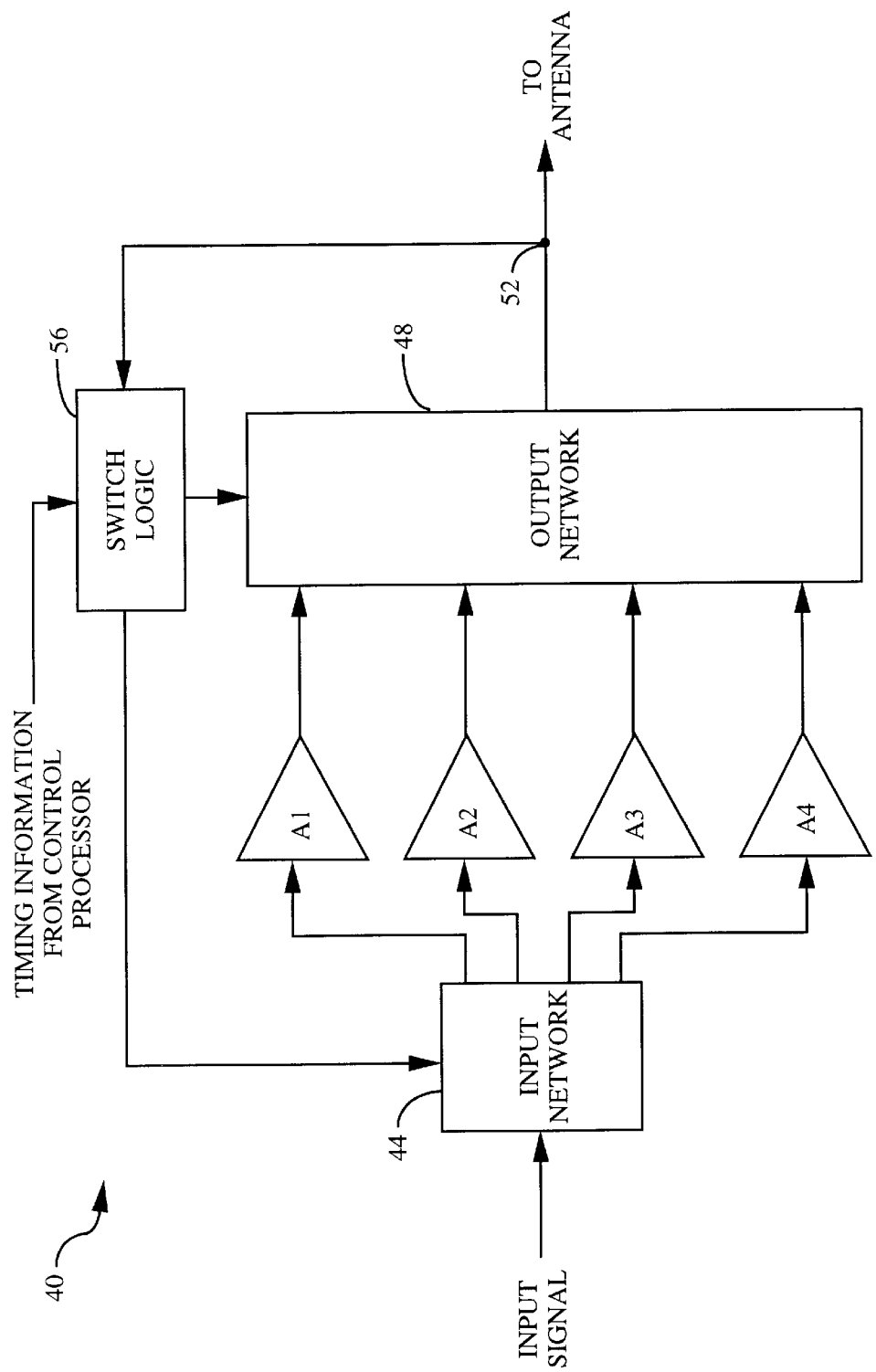
FIG. 2 shows a simplified block diagram of a parallel stage amplifier of the present invention.

Turning now to FIG. 2, there is shown a simplified block diagram of a parallel-stage amplifier 40 of the present invention. An input signal, typically a digitally-modulated RF communication signal, is received by an input network 44 from an RF transmit modulator (not shown). The input network 44 relays the input signal to at least one of an exemplary set of four parallel amplifier stages A1–A4. In the simplest embodiment, input network 44 is a switch matrix which selectively provides the input signal to one of the parallel amplifier stages A1–A4. However, other implementations of the input network 44 (see FIG. 4) may effect input switching in a manner which minimizes distortion and signal loss. In a preferred implementation the amplifier stages A1–A4 each include a high-frequency field-effect transistor (FET) or bipolar junction transistor (BJT) power amplifier.

The outputs from the amplifier stages A1–A4 are provided to an output network 48, which couples the amplified RF output signal from the selected amplifier stage, or stages, A1–A4 to an amplifier output node 52. Although the output network 48 may be realized using a switch matrix or the like, other implementations of the output network 48 described below (see FIG. 4) effect output switching in a manner which minimizes distortion and signal loss. The amplified RF signal is provided to a transmit antenna (not shown), as well as to switch logic 56. The switch logic 56 monitors the level of the amplified RF signal at output node 52, and instructs the input network 44 and output network 48 to select the amplifier stage A1–A4 designed to provide output power over a range in which is included the monitored output signal level. In an alternate embodiment, switch logic 56 may monitor a received power level or power control commands from an associated base station.

Figure 3:
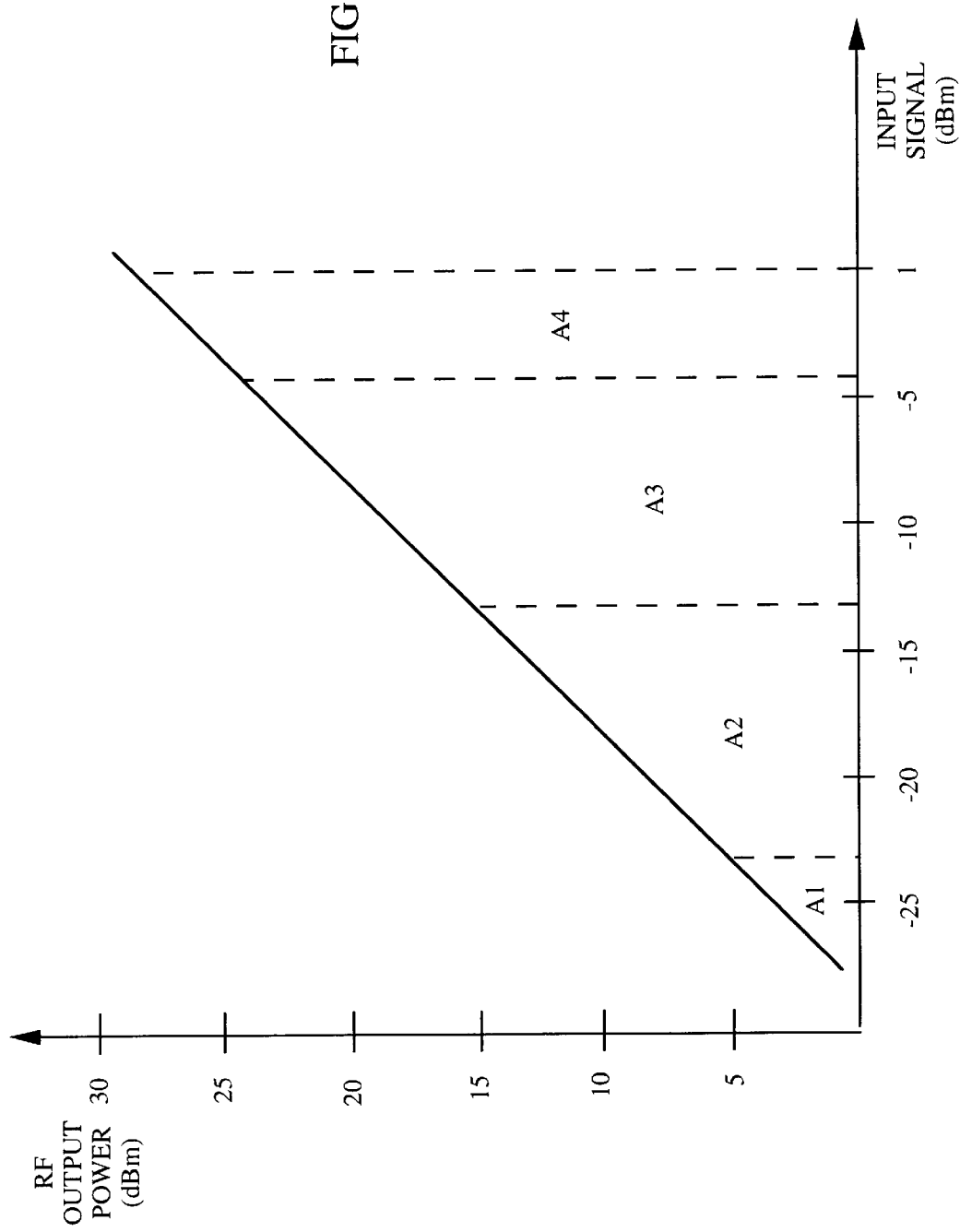
FIG. 3 illustratively represents an exemplary scheme for biasing the amplifier stages A1–A4 within the parallel stage amplifier of FIG. 2.

In a preferred embodiment illustrated in FIG. 3, the amplifier stages A1–A4 are each biased to provide identical gain over a different output signal range. In an exemplary embodiment, the amplifier stage A1 is biased so as to provide approximately 28 dB of linear gain for output power of up to 5 dBm in response to input signals of up to −23 dBm. Similarly, the amplifier stages A2, A3 and A4 are each biased to produce the same linear gain as stage A1 over different output signal ranges. Specifically, in the exemplary embodiment of FIG. 3 the amplifier stage A2 produces output signal energy over the range of 5–15 dBm in response to input signals between −23 to −13 dBm, while amplifier stages A3 and A4 provide output signal energy of between 15–24 dBm and 24–28 dBm for input signals between −13 to −4 dBm and −4 to +1 dBm, respectively. When the amplifier stages are implemented as FET or BJT devices, a bias network (not shown) may be employed to supply the level of bias current to each amplifier stage required for operation over the specified output range. It should be noted that the gain values and ranges of FIG. 3 are intended to serve as a specific example, and that quite different input and output power ranges may be associated with alternate implementations.

Considering again the specific case of FIG. 3, assume that the input signal level is increasing and is approaching −23 dBm. In this instance the input signal will continue to be applied to the amplifier stage A1 until switch logic 56 senses that the level of the RF output signal has risen to approximately 5 dBm. At this juncture switch logic 56 commands the input network 44 to apply the input signal to amplifier stage A2, and instructs the output network 48 to begin coupling the resultant amplified RF output signal from A2 to output node 52. A similar transition between amplifier stages A2 and A3, and between stages A3 and A4, is controlled by switch logic 56 upon the RF output signal level approaching 15 and 24 dBm, respectively. Optionally, switch logic 56 may provide for hysteresis to prevent excessive switching between adjacent amplifier stages A1–A4 when the input signal level varies while near a transitional boundary. Since each of the amplifier stages A1–A4 is realized to exhibit an identical gain over a specified RF output signal range, the parallel amplifier 40 appears to surrounding circuit elements as a unitary amplifier having constant gain over the entire output range. This characteristic of the invention advantageously simplifies the design associated RF transmit circuitry, since it obviates the need to accommodate gain variation over the output signal range. It should be noted that although preferably only one of individual amplifier stages A1–A4 described by FIG. 3 may be turned ON at one time, other embodiments, described below, may turn ON/OFF varying combinations of amplifier stages at one time to obtain the desired RF output.

As is indicated by FIG. 2, timing information relating to boundaries between the digital words or symbols inherent within the digitally-modulated input signal is provided to switch logic 56 from the local control processor. In accordance with another aspect of the invention, the switch logic 56 only instructs the input network 44 and output network 48 to select a different one of the amplifier stages A1–A4 during transitions between the digital words or symbols within the input signal. This ensures that any phase difference between the signal paths through the amplifier stages A1–A4 does not corrupt the integrity of the digital information carried by the amplified RF output signal. For example, in the exemplary CDMA modulation format described below, a digital input data stream is encoded using a set of orthogonal Walsh codes, or "symbols". In this embodiment, switch logic 56 is enabled to instruct the input network 44 and output network 48 to switch between amplifier stages A1–A4 only during transitions between Walsh symbols. Since in an exemplary embodiment the period of each Walsh symbol is very short (e.g., 3.25 ms) relative to the rate of change of the RF output power, a number of opportunities will typically be available for switching between amplifier stages proximate the time of crossing of the RF output signal level into a different output range.

Figure 4:
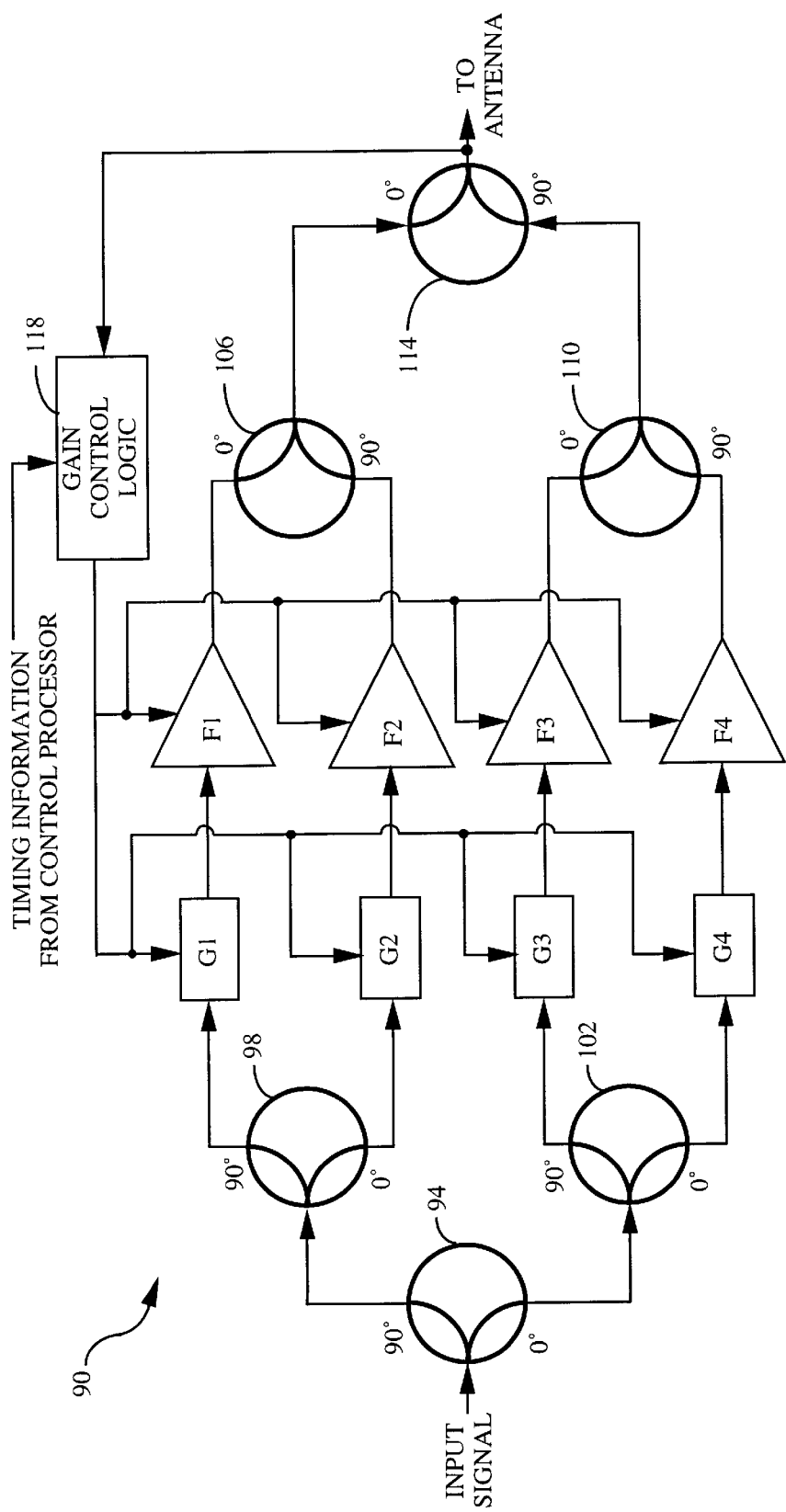
FIG. 4 is a block diagram of an alternate embodiment of a parallel-stage amplifier of the present invention.

Turning now to FIG. 4, a block diagram is provided of an alternate embodiment of a parallel-stage amplifier 90 of the present invention. An input signal, again typically a digitally-modulated RF communication signal, is received by a first quadrature-phase divider 94. The first quadrature-phase divider 94 divides the input signal into a pair of input signal components of equivalent magnitude and quadrature phase. The quadrature-phase signal components from the first divider 94 are provided to second and third quadrature-phase dividers 98 and 102. The second divider 98 provides quadrature-phase outputs to gain adjustment elements G1 and G2, and the third divider 102 provides quadrature-phase outputs to gain adjustment elements G3 and G4. The gain adjustment elements G1–G4 are each serially connected to a corresponding one of fixed-gain amplifiers F1–F4, with each serial connection of a gain adjustment element and a fixed-gain amplifier forming an adjustable-gain amplifier stage.

The outputs of the adjustable-gain amplifier stages are combined using an arrangement of first, second and third quadrature-phase combiners 106, 110 and 114. The resultant amplified output signal is forwarded to a transmit antenna (not shown), as well as to gain control logic 118. Gain control logic 118 operates to set the overall amplifier gain by selecting various combinations of the adjustable-gain amplifier stages, and by setting the gain of each adjustable-gain stage. In the exemplary embodiment of FIG. 4, each of the fixed gain amplifiers F1–F4 are biased to provide an identical nominal gain of N dB, and each gain-adjustment element G1–G4 may be set at a gain/attenuation of −3 dB, or at 0 dB. This allows a desired level of RF output power to be produced by setting the gain of selected ones of the adjustable-gain amplifier stages as indicated below in TABLE I.

TABLE I

| RF Output Power | Amplifiers Selected | Gain-Adjustment Settings | | | |
|---|---|---|---|---|---|
| | | G1 | G2 | G3 | G4 |
| N dB | F1, F2, F3, F4 | −3 dB | −3 dB | −3 dB | −3 dB |
| (N − 3) dB | F1, F2 | 0 dB | 0 dB | — | — |
| (N − 6) dB | F1 | 0 dB | — | — | — |

Referring to the first row of entries within TABLE I, when each of the amplifiers F1–F4 are actuated, and each of the gain-adjustment elements G1–G4 are set to −3 dB, an RF output power of N dB is produced. If the level of the input signal decreases such that the RF output power approaches (N−3) dB, then fixed-gain amplifiers F3 and F4 are turned-off and gain-adjustment elements G1 and G2 are set to 0 dB. As is indicated by TABLE I, when fixed-gain amplifiers F3 and F4 are turned off the setting of gain-adjustment elements G3 and G4 becomes irrelevant. If it is then subsequently desired to reduce the RF output power level to (N−6) dB, fixed-gain amplifier F2 is turned off and the gain-adjustment elements G1 is returned to a setting of 0 dB. Again, timing information from the control processor allows gain control logic 118 to switch the fixed-gain amplifiers F1–F4 ON/OFF only during transitions between the digital words or symbols inherent within the input signal, and gain control logic 118 may provide for hysteresis to avoid excessive switching of gain-adjustment elements G1–G4 and fixed-gain amplifiers F1–F4 when the output power varies near a switching boundary.

The output impedance of the amplifier stages is unimportant when they are turned OFF due to first, second and third quadrature-phase combiners 106, 110 and 114. However, DC efficiency is maintained by turning on only those amplifier stages F1–F4 which are needed to produce the desired RF output power.

It should be noted that although FIG. 4 represents a preferred embodiment, other embodiments using phase shifting and combining are also possible. For example, the gain-adjustment elements G1–G4 could be replaced by only two gain-adjustment elements, each positioned immediately before quadrature-phase dividers 98 and 102, respectively. Alternatively, a single gain-adjustment element could be positioned immediately before quadrature-phase divider 94. In the extreme, the gain-adjustment elements G1–G4 could be eliminated altogether, with the resulting change in overall gain of the amplifier 90 being compensated for by other circuitry in the system employing the present invention. Furthermore, quadrature-phase dividers 94, 98, and 102, as well as quadrature-phase combiners 106, 110, and 114 could be replaced by any type of phase shifter. It is also noteworthy that the number of quadrature-phase dividers and combiners is driven only by the number of parallel amplification stages.

Figure 5A:
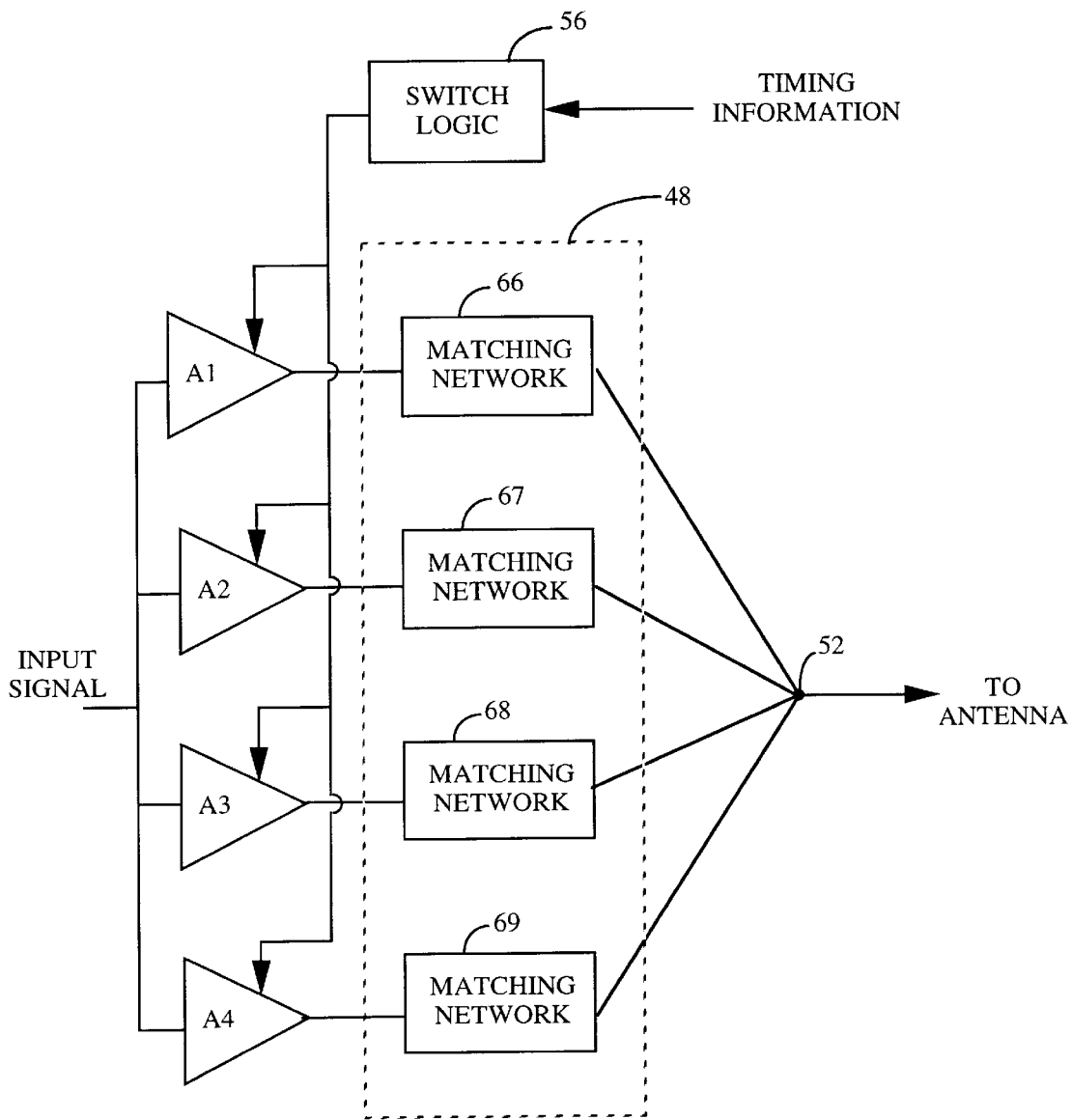
FIG. 5A depicts an alternate embodiment of the present invention wherein the input and output switching functions are inherent to the amplifier stages themselves.

Referring now to FIG. 5A, yet another embodiment of the present invention is depicted in which selection between amplifier stages is accomplished by turning ON/OFF the transistor amplifier(s) comprising each stage. In the embodiment of FIG. 5A, each amplifier stage A1–A4 is assumed to be comprised of one or more field-effect transistor (FET) devices. However, it is understood that each of these amplifier stages could be a BJT or other active device. A given stage is selected by activating the FET devices comprising the stage, and is deselected by turning OFF the given FET devices and ensuring that the output impedance of the powered-off FETs is high to minimize adverse loading by the powered-off FETs. In this way, additive combination of a desired number of stages is achieved by selectively turning ON/OFF the FET devices for each stage A1–A4. In contrast to the embodiment of FIG. 2, both the input switching function and the output switching function are inherent to the FET devices themselves. Thus, switch logic 56 controls amplifier stages A1–A4 directly.

The output network 48 includes matching elements 66–69 connected respectively between the amplifier stages A1–A4 and the output node 52. The matching elements 66–69 serve to provide an optimum power match between the outputs of the amplifier stages A1–A4 and the antenna (not shown) coupled to output node 52. Each combination of an amplifier stage A1–A4 and an associated matching element 66–69 provides nearly equivalent signal gain, and each such combination is turned ON/OFF by switch logic 56 as necessary to achieve a desired level of output power. Accordingly, only the number of amplifier stages A1–A4 required to produce the desired level of output power are turned ON at any given instant of time, thereby conserving DC power and maintaining nearly constant efficiency. Furthermore, by using the individual stages A1–A4 to accomplish the output switching function, and an output network 48 which comprises matching elements 66–69, one may avoid power loss and signal distortion through a switch.

Figure 5B:
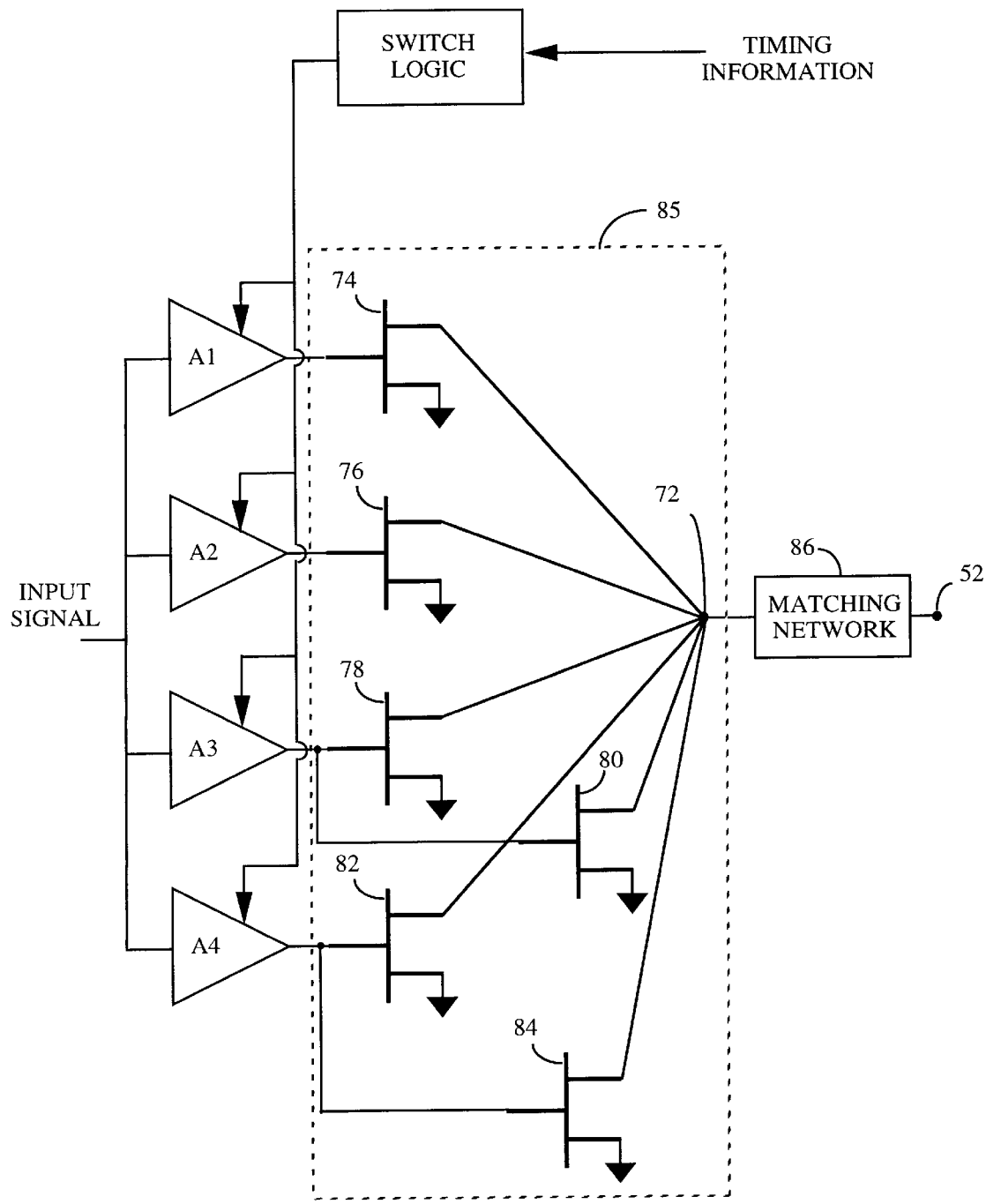
FIG. 5B depicts yet another embodiment of the present invention wherein the input and output switching functions are inherent to the amplifier stages themselves.

FIG. 5B shows yet another embodiment of the present invention, in which one or more amplifier gain cells or transistors are interposed between the output of each amplifier stage A1–A4 intermediate node 72. FIG. 5B is similar to FIG. 5A. However, instead of individual matching networks 66–69 for each amplifier device, a final amplifier device 85, comprising multiple gain cells 74–84 within the final amplifier device 85, is coupled to a single matching network 86. In the exemplary embodiment of FIG. 5B, a single gain cell transistor 74 is connected between stage A1 and the intermediate node 72. Similarly, single gain cell transistor 76 is connected between stage A2 and the intermediate node 72. A pair of gain cell transistors 78, 80 are connected between stage A3 and the intermediate node 72, and another pair of gain cell transistors 82, 84 are connected between stage A4 and the intermediate node 72. In contrast to the output network depicted in FIG. 5A, the implementation of FIG. 5B uses a single final amplification device 85 in which each of the individual gain cells 74–84 within the final amplification device 85 may have a separate input. This allows for a reduction in physical size and cost, and permits fabrication of the final amplification device 85 upon a single die. As in the embodiment of FIG. 5A, no output switch is required because if gain cell 74–84 are either BJTs or FETs, biasing them off puts their respective outputs in a high impedance state, with minimal real loading.

Each gain cell 74–84 is turned ON/OFF via a bias current provided by its preceding amplifier stage A1–A4. By turning ON/OFF a particular set of the gain cell transistors, a desired level of output power is accommodated. It is noted in this exemplary embodiment that when stage A3 or A4 is activated, sufficient bias current is produced to turn ON both gain cell transistors (78,80) or (82,84), respectively. It should also be noted that although amplifier stages A3 and A4 each drive two separate cell transistors (78,80) and (82,84), respectively, alternate embodiments may use more or fewer gain cell transistors in each stage.

Consider now an exemplary implementation of the amplifier of FIG. 5B in which each gain cell transistor 74–84 is designed to provide approximately 1 Watt of power when biased ON by its preceding amplifier stage A1–A4. TABLE II lists the different levels of output power produced by this exemplary implementation when various combinations of gain cell transistors are biased ON by their respective amplifier stages A1–A4. Examining TABLE II, one can see that by turning ON either amplifier stage A1 or A2, the total RF output power may be increased by one watt, while turning on either amplifier stage A3 or A4, the total RF output power may be increased by two watts. Thus, according to the method of TABLE II, the specific embodiment of FIG. 5B can be used to generate varying RF output power levels from one to six watts, using four amplifier stages A1–A4, and maintaining DC efficiency by biasing ON only those stages that are necessary to generate the desired output power. Note that TABLE II represents merely an exemplary implementation, and that gain cell transistors 74–84 each could be designed to provide more or less than one watt. However, selecting each gain cell 74–84 to be the same size simplifies manufacturing of the final amplification device 85.

In the specific implementation of FIG. 5B represented by the first row of TABLE II, if only one amplifier stage and its associated gain cell transistor, for example A1 and transistor 74, is biased ON, with all others A2–A4 biased off, the reactive loading of the off-state transistors (76, 78, 80, 82, 84) may not provide optimum gain matching when using only a single output matching circuit 86. However, improved DC efficiency at the low output level, for example 1 watt as indicated by TABLE II, is achieved. Furthermore, any gain mismatch may be adjusted for in the individual amplifier stages selected, in this case A1, or in the associated system where the invention is employed.

TABLE II

| Amplifier Stage and Gain Cell(s) | | | | Total RF Output |
|---|---|---|---|---|
| A1 (74) | A2 (76) | A3 (78, 80) | A4 (82, 84) | Power (Watts) |
| ON | OFF | OFF | OFF | 1 |
| OFF | OFF | ON | OFF | 2 |
| ON | OFF | ON | OFF | 3 |
| OFF | OFF | ON | ON | 4 |
| ON | OFF | ON | ON | 5 |
| ON | ON | ON | ON | 6 |

Figure 11:
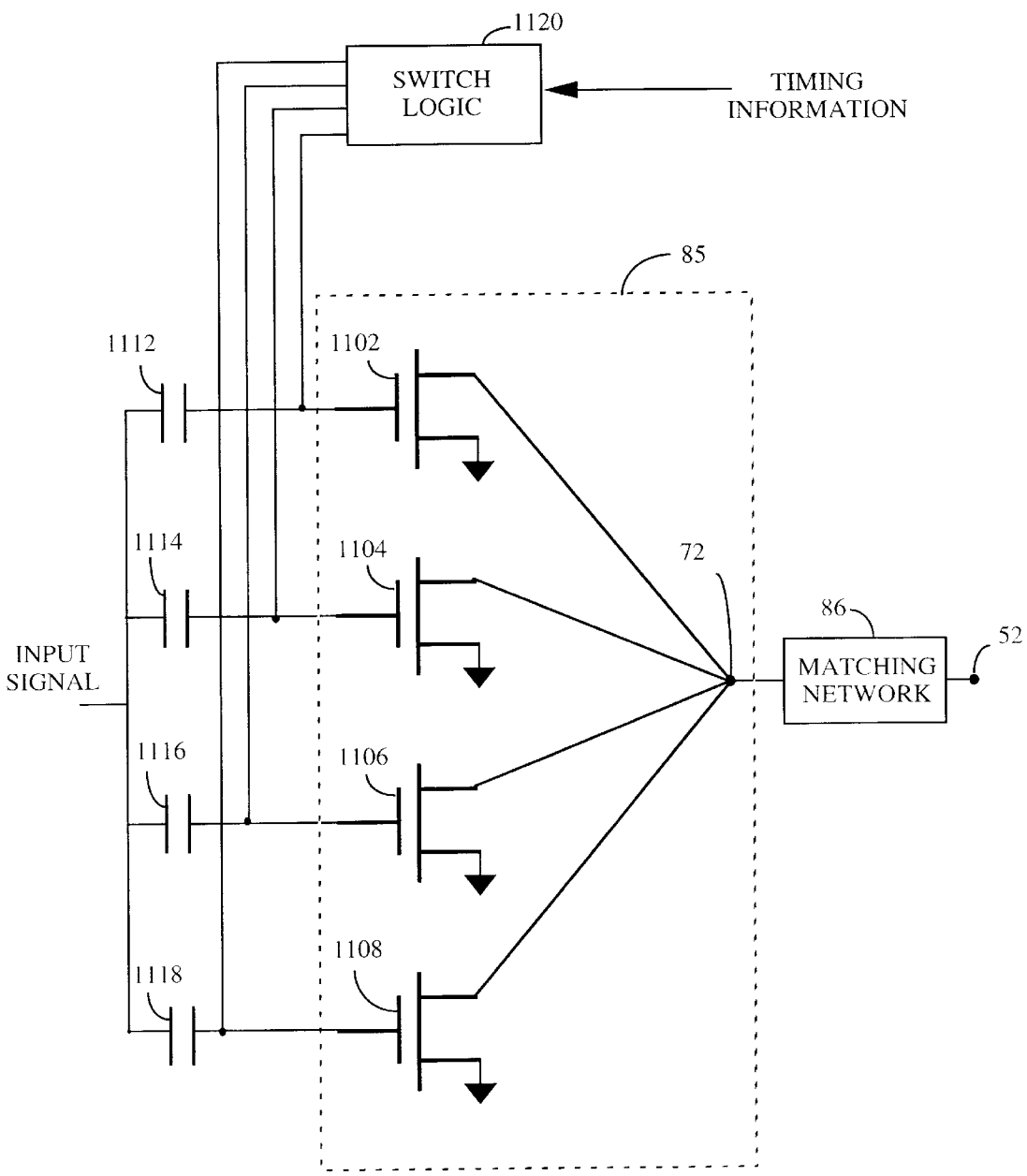
FIG. 11 depicts yet another embodiment of the present invention wherein the input and output switching functions are inherent to the amplifier stages themselves.

Yet another embodiment, similar to that of FIG. 5B is shown in FIG. 11. The embodiment of FIG. 11 differs from that of FIG. 5B in that the input signal does not pass through four individually switched driver amplifiers, but rather is provided directly to four different final stage transistor devices, 1102, 1104, 1106, and 1108. It should be noted that any one or all of the devices 1102–1108 may be either single or multiple-gate devices and that the configuration shown is merely exemplary. Additionally, although the devices 1102–1108 are illustrated in FIG. 11 as FET devices sharing a common gate and common drain, as was previously mentioned with respect to the previous Figures, they may also be BJT devices sharing a common emitter and common base, or a combination of different device types as may be permitted to be manufactured on a single die. Additionally, each of the devices 1102–1108 may be of different gain values.

The respective gates of the devices 1102–1108 are isolated at DC by blocking capacitors 1112, 1114, 1116, and 1118, but are tied together at the RF frequency of the input signal. Switch logic 1120 selectively provides a DC bias current only to the devices 1102–1108 which are required for amplification of the input signal. Thus, by biasing on only the devices that are required for the present amplifition of the input signal, DC efficiency is improved significantly. As a result, a final stage amplification scheme similar to that of TABLE II above may be implemented. An input matching network (not shown), preferably optimized for best performance with all devices 1102–1108 active, may also be included.

III. Dual-Transistor Amplifier Stage

Figure 9:
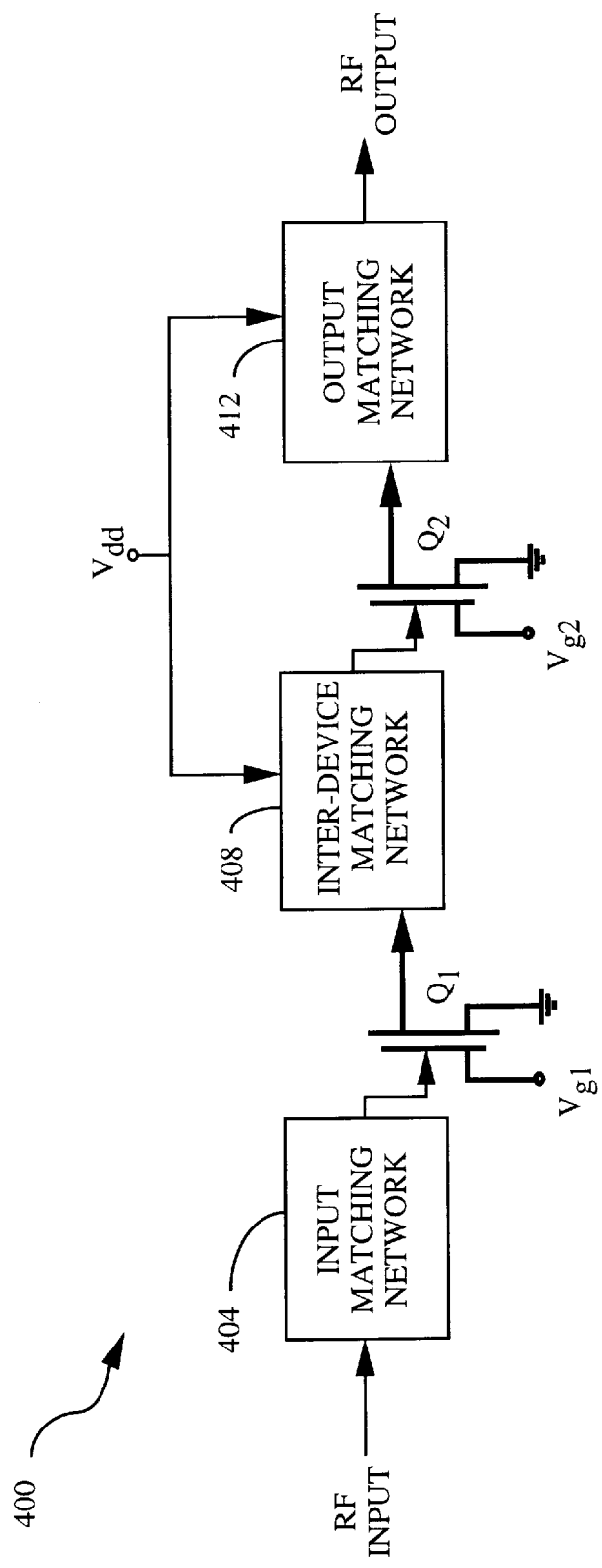
FIG. 9 is a schematic representation of a dual-transistor amplifier suitable for use as a single stage of the parallel stage amplifier of the invention.

FIG. 9 is a schematic representation of a dual-transistor amplifier 400 suitable for use as a single stage (e.g., as one of the stages A1–A4) within the parallel stage amplifier of the invention. The amplifier stage 400 includes an input driver FET (Q1) and an output FET (Q2). Although in FIG. 9 a pair of dual-gate field-effect transistors (Q1, Q2) comprise the amplifier stage 400, it is understood that in alternate embodiments single-gate field effect transistors (FET), or bipolar junction transistors (BJT) or transistors realized using other device technologies may be employed.

The small signal input to the amplifier 400 is applied to the gate of FET Q1 through an input matching network 404, which is designed to optimize power transfer into FET Q1. Similarly, an inter-device matching network 408 serves to maximize power transfer from the output of FET Q1 to the input of FET Q2. In like manner an output matching network 412 provides an optimum power match between the output impedance of FET Q2 and the load (not shown) driven by the amplifier 400.

The quiescent bias currents through FETs Q1 and Q2 are controlled through adjustment of the DC gate potentials $V_{g1}$ and $V_{g2}$, respectively. Typically, the DC gate potentials $V_{g1}$ and $V_{g2}$ are set such that the amplifier 400 exhibits constant gain over low and high output power levels. In the embodiment of FIG. 9, the dimensions of input FET Q1 are selected to be smaller than the corresponding dimensions of output FET Q2 by an exemplary ratio of approximately 8:1, it being understood that other ratios may be more suitable for alternate implementations. This design leads to enhanced efficiency by enabling the bias current supplied to output FET Q2 to be substantially reduced when only low levels of output power are required from the amplifier 400. When only a low level of output power is required, the bias current through FET Q2 is reduced relative to the bias current required for an intermediate level of output power, and the bias current through FET Q1 is somewhat increased. Since the smaller input FET Q1 is capable of operating more efficiently than the larger output FET Q2 for low output power levels, the efficiency of the amplifier 400 is increased by substantially reducing the bias current through FET Q2 during low-power operation. Changes in bias current may be effected by controlling the DC gate potentials $V_{g1}$ and $V_{g2}$ in an analog fashion, or through adjustment in discrete steps.

IV. Efficient Power Amplifier within a CDMA Portable Unit

Figure 6:
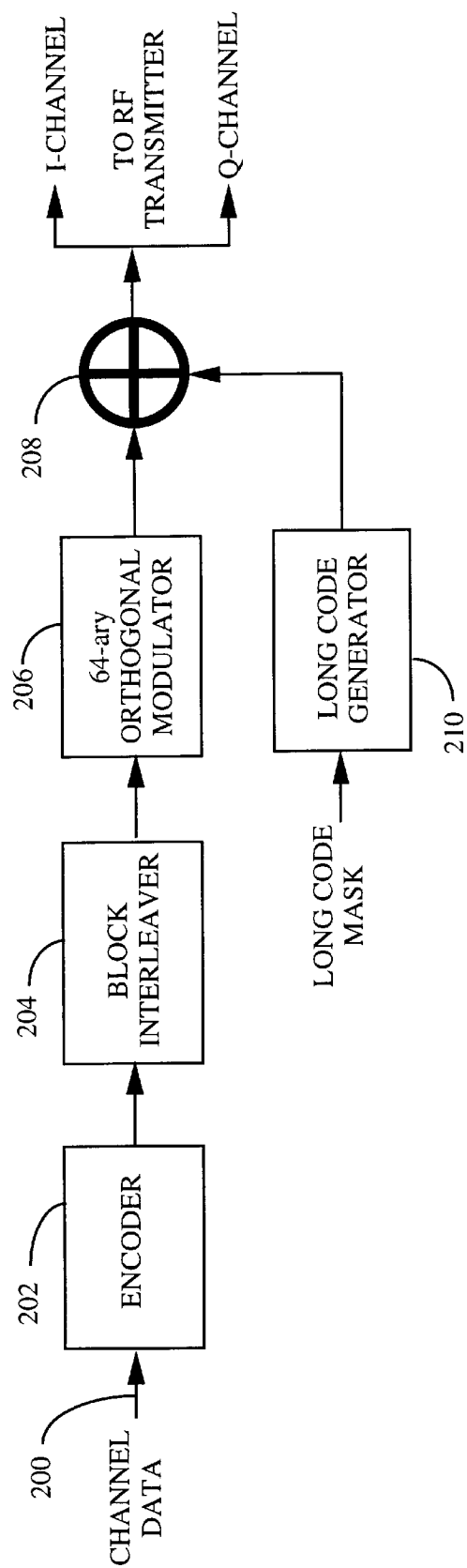
FIG. 6 provides a block diagrammatic representation of a portable unit spread spectrum transmitter in which may be incorporated an efficient parallel stage amplifier of the present invention.

Referring to FIG. 6, there is shown a block diagrammatic representation of a portable unit spread spectrum transmitter in which may be incorporated an efficient parallel stage amplifier of the present invention. In an exemplary CDMA system, orthogonal signaling is employed to provide a suitable ratio of signal to noise on the portable unit-to-base station link, i.e., on the "reverse" link.

In the transmitter of FIG. 6, data bits 200 consisting of, for example, voice converted to data by a vocoder, are supplied to an encoder 202 where the bits are convolutionally encoded. When the data bit rate is less than the bit processing rate of the encoder 202, code symbol repetition may be used such that encoder 202 repeats the input data bits 200 in order to create a repetitive data stream at a bit rate which matches the operative rate of encoder 202. In an exemplary embodiment the encoder 202 receives data bits 200 at a nominal bit rate ($R_b$) of 11.6 kbits/second, and produces $R_b/r=34.8$ symbols/second, where "r" denotes the code rate (e.g. ⅓) of the encoder 202. The encoded data is then provided to block interleaver 204 where it is block interleaved.

Within the 64-ary orthogonal modulator 206, the symbols are grouped into characters containing $\log_2 64=6$ symbols at a rate of $(1/r)(R_b/\log_2 64)=5,800$ characters/second, with there being 64 possible characters. In a preferred embodiment each character is encoded into a Walsh sequence of length 64. That is, each Walsh sequence includes 64 binary bits or "chips", there being a set of 64 Walsh codes of length 64. The 64 orthogonal codes correspond to Walsh codes from a 64 by 64 Hadamard matrix wherein a Walsh code is a single row or column of the matrix.

The Walsh sequence produced by the modulator 206 is seen to be provided to an exclusive-OR combiner 208, where it is then "covered" or multiplied at a combiner with a PN code specific to a particular portable unit. Such a "long" PN code is generated at rate Rc by a PN long code generator 210 in accordance with a user PN long code mask. In an exemplary embodiment the long code generator 210 operates at an exemplary chip rate, $R_c$, of 1.2288 Mhz so as to produce four PN chips per Walsh chip. In accordance with the invention, an efficient parallel stage amplifier within the portable unit transmitter is permitted to change state only between those PN chips at the boundary of each Walsh code symbol (i.e, after the last, and prior to the first, PN chip of successive code symbols).

Figure 7:
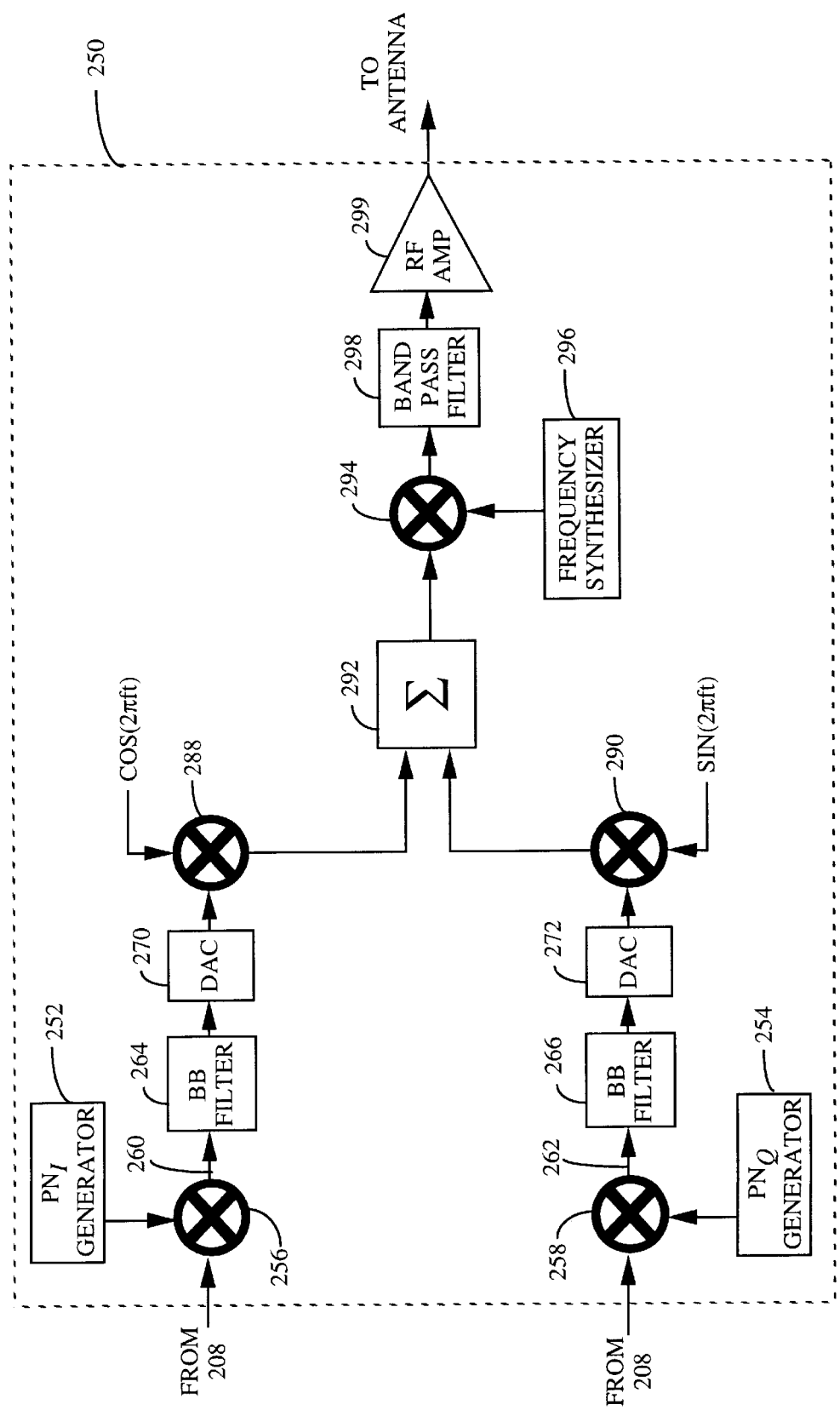
FIG. 7 shows an exemplary implementation of an RF transmitter included within the spread spectrum transmitter of FIG. 6.

Referring to FIG. 7, there is shown an exemplary implementation of the RF transmitter 250. In code division multiple access (CDMA) spread spectrum applications, a pair of short PN sequences, $PN_I$ and $PN_Q$, are respectively provided by a $PN_I$ generator 252 and by a $PN_Q$ generator 254 to exclusive-OR combiners 256 and 258. The $PN_I$ and $PN_Q$ sequences relate respectively to in-phase (I) and quadrature phase (Q) communication channels, and are generally of a length (32,768 chips) much shorter than the length of each user long PN code. The resulting I-channel code spread sequence 260 and Q-channel code spread sequence 262 are then passed through baseband filters 264 and 266, respectively.

Digital to analog (D/A) converters 270 and 272 are provided for converting the digital I-channel and Q-channel information, respectively, into analog form. The analog waveforms produced by D/A converters 270 and 272 are provided along with local oscillator (LO) carrier frequency signals $\cos(2\pi ft)$ and $\sin(2\pi ft)$, respectively, to mixers 288 and 290 where they are mixed and provided to summer 292. The quadrature phase carrier signals $\sin(2\pi ft)$ and $\cos(2\pi ft)$ are provided from suitable frequency sources (not shown). These mixed IF signals are summed in summer 292 and provided to mixer 294.

Mixer 294 mixes the summed signal with an RF frequency signal from frequency synthesizer 296 so as to provide frequency upconversion to the RF frequency band. The RF may then be bandpass filtered 298 and provided to an efficient parallel stage RF amplifier 299 of the invention. Again, the portable unit controller ensures proper phase is maintained by allowing the selected combination of amplifier stages within the amplifier 299 to be changed only between the PN chips defining the transitions between each Walsh code symbol.

V. Dual-Stage Parallel Amplifier in a CDMA Portable Unit

Figure 8:
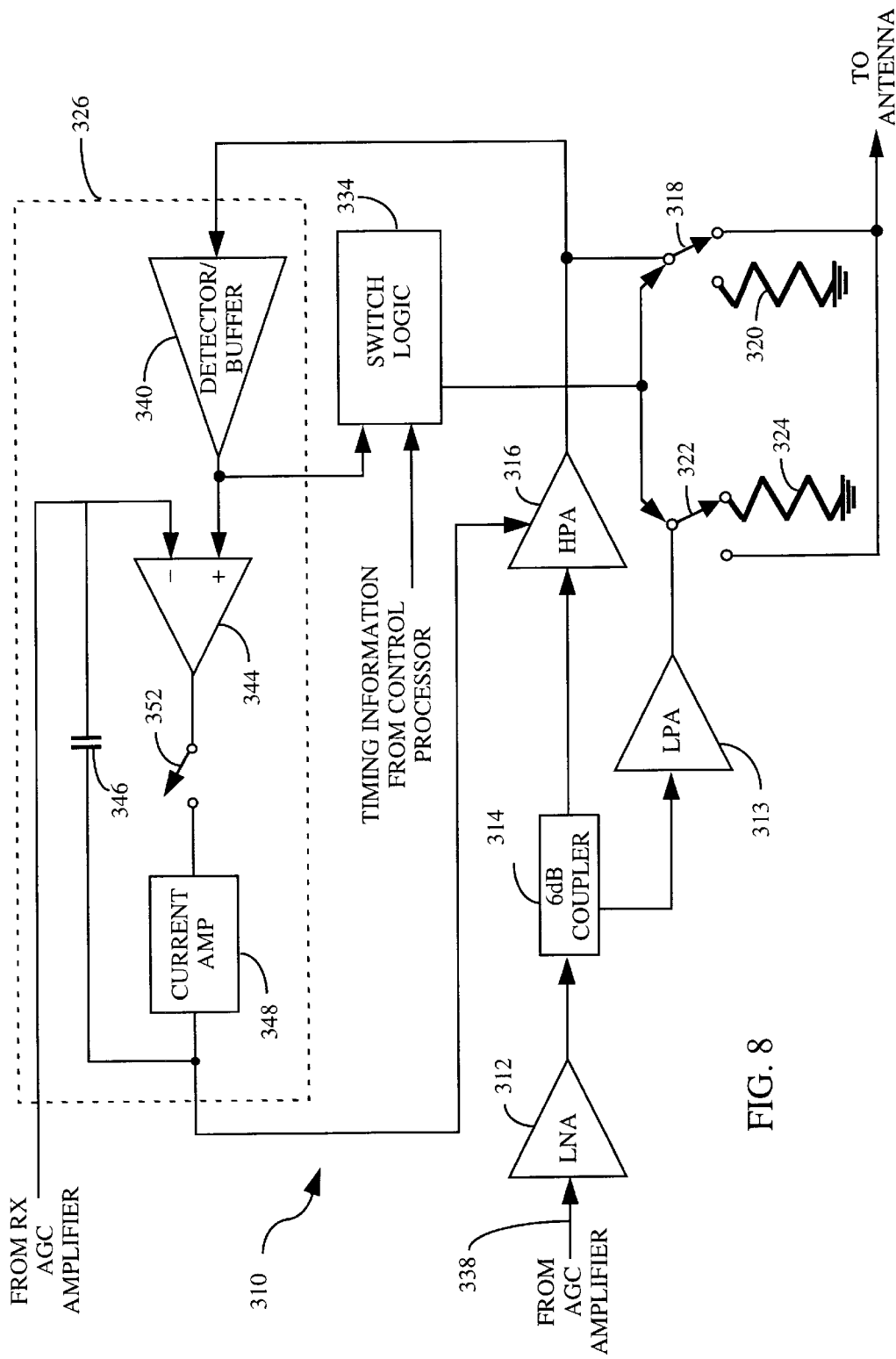
FIG. 8 is a block diagram of an embodiment of the inventive parallel-stage amplifier designed for low-noise signal amplification.

FIG. 8 is a block diagram a parallel-stage amplifier 310 designed for signal amplification over a wide dynamic range in a CDMA portable unit such as that described above and illustrated in FIGS. 6 and 7. Amplifier 310 includes parallel amplification stages represented by low-power amplifier (LPA) 313 and high power amplifier (HPA) 316, an output switch matrix represented by first and second switches (318, 322), first and second dummy loads (320, 324), and switch logic 334. Briefly, amplifier 310 yields improved DC efficiency by exclusively utilizing LPA 313, which draws a low level of DC current, when only low levels of output power are required and exclusively utilizing HPA 316 when high levels of output power are required. This efficiency is accomplished by the operation of switch logic 334, alternatively directing the respective outputs of LPA 313 and HPA 316 between first and second dummy loads (320, 324) and an antenna (not shown). During low-power operation, switch logic 334 directs first switch 318 to provide the output of HPA 316 to first dummy load 320, and directs second switch 322 to provide the output of LPA 313 to an antenna (not shown). As more transmit power is required, HPA 316 begins to produce the same power as is being transmitted by LPA 313, the output of HPA 316 being dumped into first dummy load 318. At the proper switching boundary, switch logic 334 directs first switch 318 to provide the output of HPA 316 to an antenna (not shown), and directs second switch 324 to provide the output of LPA 313 to second dummy load 324.

In the preferred embodiment the LPA 313 functions as a class A amplifier during low-power mode operation. That is, the LPA 313 provides a power gain independent of the level of the RF input signal provided thereto while the LPA 313 is not in compression. Furthermore, as a class A amplifier, LPA 313 consumes nearly constant DC power regardless of its RF output power level, again as long as LPA 313 is not in compression. During operation in low-power mode the level of output power provided to the antenna is essentially controlled by adjusting the level of RF input power provided to the LPA 313. Because LPA 313 provides uniform gain during low-power mode operation, linearly tracking the input power with minimum distortion, the RF output power level produced by LPA 313 is effectively controlled by AGC amplifier (not shown) preceding LNA 312.

In accordance with the invention, the output power appearing at the output of the HPA 316 is matched to the output power produced by the LNA 313 during a transition period immediately preceding any switch between low-power and high-power modes of operation. In particular, during the transition period the power produced by HPA 316 is monitored by a gain control loop 326. The gain control loop 326 sets the gain of the HPA 316 during the transition period to be equivalent to the gain of amplifier 313, thereby equalizing the power level at the outputs of the LNA 313 and the HPA 316. In this way a "seamless" transition is effected from low-power to high-power mode, and vice-versa. In an exemplary CDMA implementation, switch logic 334 only permits the switches 318 and 322 to be toggled at Walsh code symbol boundaries.

During high-power mode the HPA 316 operates essentially as a either a class AB or a class B amplifier. That is, the power gain and DC power consumption of the amplifier 316 are a function of the RF input power level. In the preferred embodiment, HPA 316 comprises at least one FET. Since the gate voltage of an FET amplifier affects the amount of current drawn by the FET and the FET gain, higher DC efficiency can be obtained by matching the minimum FET current required for a certain level of operation to the desired RF output power level. Since HPA 316 gain is non-linear over the desired operating range, the level of the RF signal produced by the amplifier 310 may not be controlled exclusively by adjusting the signal level provided to the HPA 316. Rather, gain control loop 326 operates to set the gain of the HPA 316 in order that a desired level of RF power is delivered to the antenna.

As is indicated by FIG. 8, the gain control loop 326 includes a detector/buffer 340 connected to the output of HPA 316. The detector/buffer 340 drives a loop integrator comprised of operational amplifier 344 and capacitor 346. Since HPA 316 typically includes one or more FET amplifiers, a current amplifier 348 may be included within the control loop 326 for providing the requisite FET amplifier bias current. Power control loop 326 sets the RF output power of HPA 316, as measured by detector/buffer 340, by controlling the gate and drain voltages of HPA 316. In this manner, the non-linearity of HPA 316 can be overcome because the input power to HPA 316, as set by the AGC amplifiers (not shown), may continue to increase as the output requirement increases, but the HPA 316 output power continues to be set by gain control loop 326.

In an exemplary implementation of the amplifier 310 suitable for inclusion within a CDMA transmitter, the gain control loop 326 may also include a switch 352, which is opened for the duration of "blank" frames during which signal power is not provided to the antenna by the amplifier 310. Such blank frames are interposed between active frames of actual data when the overall data transmission rate is less than full-rate. The switch 352 opens the integration loop just prior to commencement of each blank frame, and closes the loop immediately after commencement of the following active frame.

VI. Gain-Offset Parallel Stages

Figure 10:
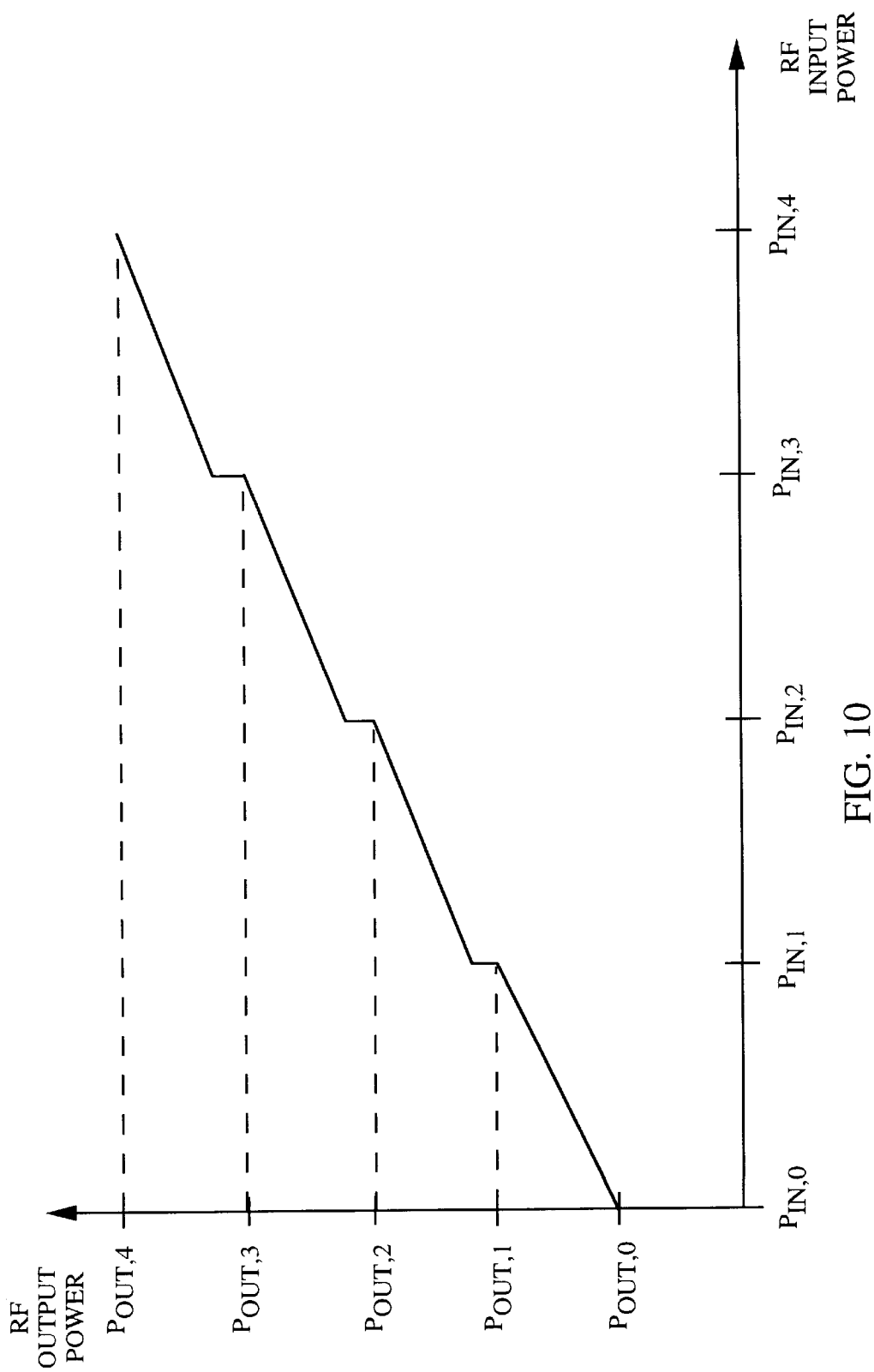
FIG. 10 illustratively represents the transfer characteristic of a parallel stage amplifier of the invention in which the constituent amplifier stages are offset in gain.

FIG. 10 illustratively represents the transfer characteristic of a parallel stage amplifier of the invention in which the constituent amplifier stages are offset in gain. For convenience, the biasing technique of FIG. 10 will be described with reference to the parallel-stage amplifier shown in FIG. 2. In the biasing approach exemplified by FIG. 10, each of the amplifier stages A1–A4 is realized to be of different gain. Switching between stages occurs in the manner described previously, but the gain offset between stages results in discontinuous variation of the power of the amplified RF output signal. As described previously, the switch logic 56 (FIG. 2) monitors the level of the amplified RF signal at output node 52. Switch logic 52 then instructs the input switch matrix and output network 48 to select the appropriate stage A1–A4 designed for operation at the monitored output signal level.

Referring to FIG. 10, the amplifier stages A1–A4 are each biased to provide linear gain in response to input signals within predefined ranges. In particular, the amplifier stage A1 is biased to produce linear gain over the output signal range $P_{OUT,0}$ to $P_{OUT,1}$ in response to input signals between $P_{IN,0}$ and $P_{IN,1}$. Similarly, the amplifier stages A2, A3, and A4 are biased to provide linear gain over the output signal ranges $P_{OUT,1}$ to $P_{OUT,2}$, $P_{OUT,2}$ to $P_{OUT,3}$, and $P_{OUT,3}$ to $P_{OUT,4}$, respectively. When the amplifier stages are implemented as FET or BJT devices, a bias network (not shown) may be employed to supply the level of bias current to each amplifier stage required for operation over the specified output range.

The gain-offset between stages contemplated by FIG. 10 may be of utility when, for example, it is desired to reduce the dynamic range required of automatic gain control (AGC) circuitry used in conjunction with the parallel stage power amplifier. It may also be of significance that the reduced gain exhibited at low-power levels results in less noise amplification at low input signal levels, where signal to noise ratio is often at a minimum. Accordingly, the gain-offset technique of FIG. 10 may advantageously be employed to improve noise performance at low input signal levels, as well as to improve the overall noise performance of a complete amplifier chain.

The previous description of the preferred embodiments are provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein, but is to be accorded the widest scope consistent with the principles and novel features disclosed herein.

We claim:

1. An amplifier circuit for providing an amplified signal in response to a radio frequency (RF) input signal having successive portions separated by signal boundaries, said amplifier circuit comprising:

a timing information input line receiving timing information representative of the boundaries between the portions of the RF input signal;

a plurality of amplifier stages for amplifying said RF input signal, each of said plurality of amplifier stages having an amplifier stage input for receiving said RF input signal and an amplifier stage output for providing an amplified RF signal, each of said amplifier stages operative to amplify the RF input signal only while a direct current (DC) bias is applied to the respective amplifier stage input thereof;

a control circuit, coupled to each amplifier stage input of said plurality of amplifier stages and to the timing information input line, for selecting particular amplifier stages to be activated and for providing a DC bias to the amplifier input stages of each of the selected amplifier stages, said control circuit operative to vary the selection of particular amplifier stages only during a boundary between portions of the RF input signal; and means, coupled to each of said amplifier stage inputs, for isolating said DC bias from the amplifier input stages of other ones of said plurality of amplifier stages.

2. The amplifier circuit of claim 1 further comprising an input network, having an input coupled to said input signal and a plurality of outputs, each output coupled to one of said amplifier stage inputs, said input network for providing said input signal to each of said plurality of amplifier stages; and an output network, coupled to each of said amplifier stage outputs, for providing said amplified signal from a selected at least one of said plurality of amplifier stages at an output network output node.

3. The amplifier circuit of claim 2 wherein said means for isolating comprises a plurality of capacitors, each capacitor having an input coupled to said input signal, and an output coupled to a respective one of said amplifier stage inputs.

4. The amplifier circuit of claim 3 wherein at least one of said plurality of amplifier stages is a field-effect transistor device.

5. The amplifier circuit of claim 3 wherein at least one of said plurality of amplifier stages is a bipolar junction transistor device.

6. A method for providing an amplified signal in response to a radio frequency (RF) input signal having successive portions separated by signal boundaries in an amplifier circuit comprising a plurality of amplifier stages each operative to amplify a signal only while simultaneously receiving a direct current (DC) bias signal, said method comprising the steps of:

receiving timing information representative of the boundaries between the portions of the RF input signal;

applying said input signal to each of said plurality of amplifier stages;

selecting an amplifier stage for use in amplifying the signal;

applying a DC bias signal to the selected amplifier stage, with said DC bias signal being initiated during a boundary between portions of the RF input signal;

isolating said DC bias signal from all but said selected one of said plurality of other amplifier stages;

amplifying said input signal in said selected amplifier stage to generate said amplified signal; and providing said amplified signal at an output node.

7. The amplifier circuit of claim 1 wherein said portions of the input RF signals are words.

8. The method of claim 6 wherein said portions of the input RF signals are words.

* * * * *